US009024201B2

(12) United States Patent
Park et al.

(10) Patent No.: US 9,024,201 B2
(45) Date of Patent: May 5, 2015

(54) MULTILAYER CERAMIC CAPACITOR AND MOUNTING CIRCUIT BOARD THEREFOR

(71) Applicant: Samsung Electro-Mechanics Co., Ltd., Suwon, Gyunggi-do (KR)

(72) Inventors: Sang Soo Park, Gyunggi-do (KR); Heung Kil Park, Gyunggi-do (KR); Min Cheol Park, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 15 days.

(21) Appl. No.: 14/061,738

(22) Filed: Oct. 23, 2013

(65) Prior Publication Data

US 2015/0014035 A1    Jan. 15, 2015

(30) Foreign Application Priority Data

Jul. 9, 2013    (KR) .................. 10-2013-0080241

(51) Int. Cl.
| | |
|---|---|
| H05K 1/00 | (2006.01) |
| H01G 2/06 | (2006.01) |
| H01G 4/30 | (2006.01) |
| H05K 1/18 | (2006.01) |
| H05K 3/46 | (2006.01) |
| H05K 1/03 | (2006.01) |

(52) U.S. Cl.
CPC .................. *H01G 2/065* (2013.01); *H01G 4/30* (2013.01); *H05K 1/181* (2013.01); *H05K 3/4629* (2013.01); *H05K 1/0306* (2013.01)

(58) Field of Classification Search
CPC .... H05K 1/181; H05K 1/0306; H05K 3/4629
See application file for complete search history.

(56) References Cited

U.S. PATENT DOCUMENTS

| | | | |
|---|---|---|---|
| 6,807,047 B2 | 10/2004 | Togashi et al. | |
| 7,706,123 B2 | 4/2010 | Togashi et al. | |
| 2006/0215350 A1 | 9/2006 | Tonogai et al. | |

FOREIGN PATENT DOCUMENTS

| | | |
|---|---|---|
| JP | 3847265 B2 | 9/2006 |
| JP | 2011-108785 A | 6/2011 |
| KR | 2006-0103860 A | 10/2006 |

OTHER PUBLICATIONS

Office Action issued on Jun. 24, 2014 in the corresponding Korean patent application No. 10-2013-0080241.

*Primary Examiner* — Jeremy C Norris
(74) *Attorney, Agent, or Firm* — McDermott Will & Emery LLP (57) ABSTRACT

There is provided a multilayer ceramic capacitor includes a ceramic body including dielectric layers; first and second external electrodes formed on end surfaces of the ceramic body; first and second terminal electrodes formed on side surfaces of the ceramic body; an active layer including a first internal electrode simultaneously connected to the first terminal electrode and the first external electrode and a second internal electrode simultaneously connected to the second terminal electrode and the second external electrode; upper and lower cover layers formed above and below the active layer; and third and fourth internal electrodes disposed to face each other on a single dielectric layer of the upper or lower cover layer and connected to the first and second terminal electrodes, respectively.

12 Claims, 8 Drawing Sheets

MULTILAYER CERAMIC CAPACITOR AND MOUNTING CIRCUIT BOARD THEREFOR

CROSS-REFERENCE TO RELATED APPLICATION

This application claims the benefit of Korean Patent Application No. 10-2013-0080241 filed on Jul. 9, 2013, with the Korean Intellectual Property Office, the disclosure of which is incorporated herein by reference.

BACKGROUND OF THE INVENTION

1. Field of the Invention

The present invention relates to a multilayer ceramic capacitor and a mounting circuit board therefor.

2. Description of the Related Art

A multilayer ceramic capacitor (MLCC) one of multilayer chip electronic components, may be used in various electronic devices, due to advantages thereof such as a small size, high capacitance, easiness of mounting, and the like.

For example, a multilayer ceramic capacitor may be used as a chip type condenser mounted on circuit boards of various electronic products including display devices such as liquid crystal displays (LCDs), plasma display panels (PDPs), and the like, computers, personal digital assistants (PDAs), cellular phones, and the like, to charge or discharge electricity.

The multilayer ceramic capacitor may have a structure in which a plurality of dielectric layers and internal electrodes having opposite polarities and interposed between the dielectric layers are alternately laminated.

In this case, since the dielectric layers have piezoelectric properties, when direct current (DC) voltage or alternating current (AC) voltage is applied to the multilayer ceramic capacitor, a piezoelectric phenomenon may be generated between the internal electrodes, such that a volume of a ceramic body is expanded and contracted according to frequency, thereby generating periodic vibrations.

The vibrations may be transmitted to a circuit board through external electrodes of the multilayer ceramic capacitor and a solder connecting the external electrodes to the circuit board, such that the entire circuit board may become an acoustically reflective surface to generate a vibration sound as noise.

The vibration sound may correspond to an audible frequency range of 20 to 20,000 Hz making listeners unpleasant. The vibration sound, potentially providing unpleasant feeling to listeners, is known as acoustic noise.

Recently, since acoustic noise generated in the multilayer ceramic capacitor as described above may be evident due to noise decrease in components of electronic devices, research into a technology for effectively decreasing the acoustic noise generated in the multilayer ceramic capacitor has been required.

In order to decrease the acoustic noise, a method of mounting the multilayer ceramic capacitor on the circuit board so as to be spaced apart from each other by a predetermined distance using a metal frame has been disclosed.

However, in order to decrease the acoustic noise to a predetermined level by using the metal frame, a distance between the metal frame and the circuit board should be increased to be greater than a predetermined standard distance.

In addition, since the above-described distance increase between the metal frame and the circuit board results in an increase in a height of a product in which the multilayer ceramic capacitor is mounted, it may be difficult to use the metal frame in a set having a height limitation.

Patent Document 1 discloses a multilayer ceramic capacitor capable of improving equivalent series resistance (ESR) and suppressing occurrence of connection defects.

RELATED ART DOCUMENT (Patent Document 1) Japanese Patent Laid-Open Publication No. JP 2011-108785

SUMMARY OF THE INVENTION

An aspect of the present invention provides a multilayer ceramic capacitor capable of effectively decreasing acoustic noise.

According to an aspect of the present invention, there is provided a multilayer ceramic capacitor including: a ceramic body including a plurality of dielectric layers and having first and second main surfaces facing each other in a thickness direction, third and fourth end surfaces facing each other in a length direction, and fifth and sixth side surfaces facing each other in a width direction; first and second external electrodes formed on the third and fourth end surfaces of the ceramic body; first and second terminal electrodes formed on the fifth and sixth side surfaces of the ceramic body; an active layer including a first internal electrode simultaneously connected to the first terminal electrode and the first external electrode and a second internal electrode simultaneously connected to the second terminal electrode and the second external electrode, the first and second internal electrodes being disposed to face each other in the ceramic body, having each of the dielectric layers interposed therebetween; upper and lower cover layers formed above and below the active layer; and third and fourth internal electrodes disposed to face each other on a single dielectric layer of the upper or lower cover layer and connected to the first and second terminal electrodes, respectively.

The dielectric layer on which the third and fourth internal electrodes are disposed may have first and second dummy electrodes formed thereon, the first and second dummy electrodes being connected to the first and second external electrodes, respectively.

The third and fourth internal electrodes may have a comb shape.

According to another aspect of the present invention, there is provided a multilayer ceramic capacitor including: a ceramic body including a plurality of dielectric layers and having first and second main surfaces facing each other in a thickness direction, third and fourth end surfaces facing each other in a length direction, and fifth and sixth side surfaces facing each other in a width direction; first and second external electrodes formed on the third and fourth end surfaces of the ceramic body; an active layer including first and second internal electrodes electrically connected to the first and second external electrodes, respectively, and disposed to face each other in the ceramic body, having each of the dielectric layers interposed therebetween; upper and lower cover layers formed above and below the active layer; and first and second dummy electrodes disposed on a single dielectric layer of the upper or lower cover layer to face each other in a length direction of the dielectric layer and connected to the first and second external electrodes, respectively.

The dielectric layer on which the first and second dummy electrodes are disposed may have a floating electrode formed thereon, the floating electrode being disposed between the first and second dummy electrodes so as to be spaced apart therefrom in the length direction of the dielectric layer.

The first and second dummy electrodes may have a comb shape.

According to another aspect of the present invention, there is provided a mounting circuit board for a multilayer ceramic capacitor, the mounting circuit board including: a circuit board having first and second electrode pads disposed thereon; and at least one multilayer ceramic capacitor mounted on the circuit board, wherein the multilayer ceramic capacitor includes: a ceramic body including a plurality of dielectric layers and having first and second main surfaces facing each other in a thickness direction, third and fourth end surfaces facing each other in a length direction, and fifth and sixth side surfaces facing each other in a width direction; first and second external electrodes formed on the third and fourth end surfaces of the ceramic body and electrically connected to the first and second electrode pads, respectively; first and second terminal electrodes formed on the fifth and sixth side surfaces of the ceramic body; an active layer including a first internal electrode simultaneously connected to the first terminal electrode and the first external electrode and a second internal electrode simultaneously connected to the second terminal electrode and the second external electrode, the first and second internal electrodes being disposed to face each other in the ceramic body, having each of the dielectric layers interposed therebetween; upper and lower cover layers formed above and below the active layer; and third and fourth internal electrodes disposed to face each other on a single dielectric layer of the upper or lower cover layer and connected to the first and second terminal electrodes, respectively.

According to another aspect of the present invention, there is provided a mounting circuit board for a multilayer ceramic capacitor, the mounting circuit board including: a circuit board having first and second electrode pads disposed thereon; and at least one multilayer ceramic capacitor mounted on the circuit board, wherein the multilayer ceramic capacitor includes: a ceramic body including a plurality of dielectric layers and having first and second main surfaces facing each other in a thickness direction, third and fourth end surfaces facing each other in a length direction, and fifth and sixth side surfaces facing each other in a width direction; first and second external electrodes formed on the third and fourth end surfaces of the ceramic body and electrically connected to the first and second electrode pads; an active layer including first and second internal electrodes electrically connected to the first and second external electrodes, disposed to face each other in the ceramic body, having each of the dielectric layers interposed therebetween; upper and lower cover layers formed above and below the active layer; and first and second dummy electrodes disposed on a single dielectric layer of the upper or lower cover layer to face each other in a length direction of the dielectric layer and connected to the first and second external electrodes, respectively.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Multilayer Ceramic Capacitor

Figure 1:
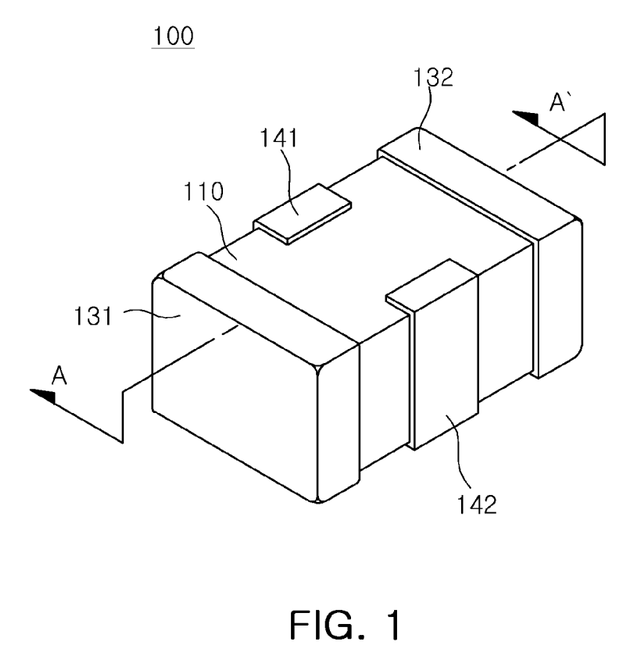
FIG. 1 is a perspective view schematically showing a multilayer ceramic capacitor according to an embodiment of the present invention.
Figure 2A:
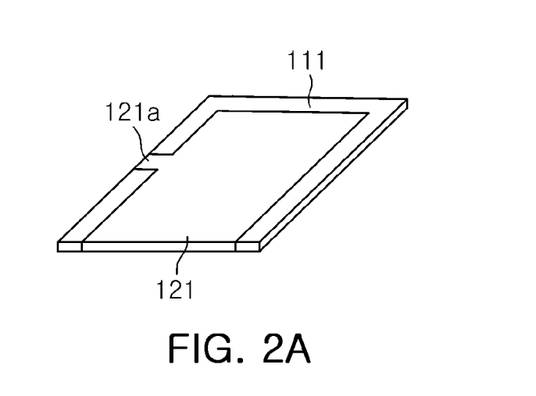
FIGS. 2A through 2C are perspective views showing first and fourth internal electrodes and first and second dummy electrodes applied to the multilayer ceramic capacitor of FIG. 1.
Figure 2B:
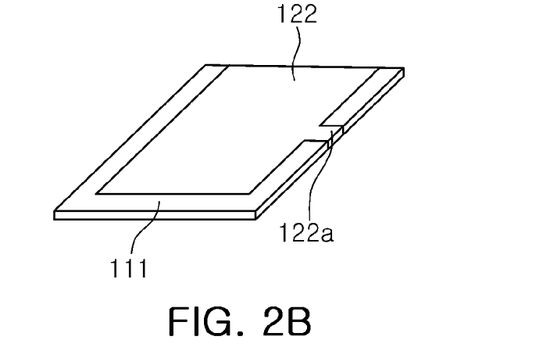
Figure 2C:
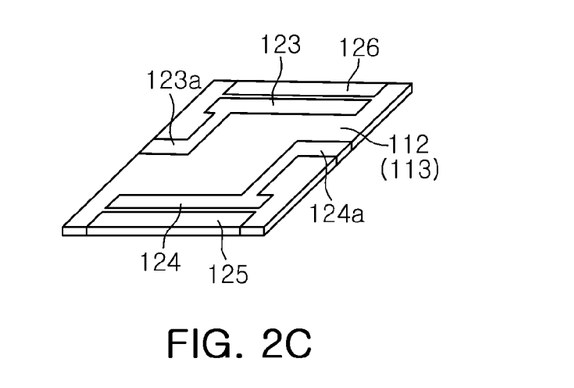
Figure 3:
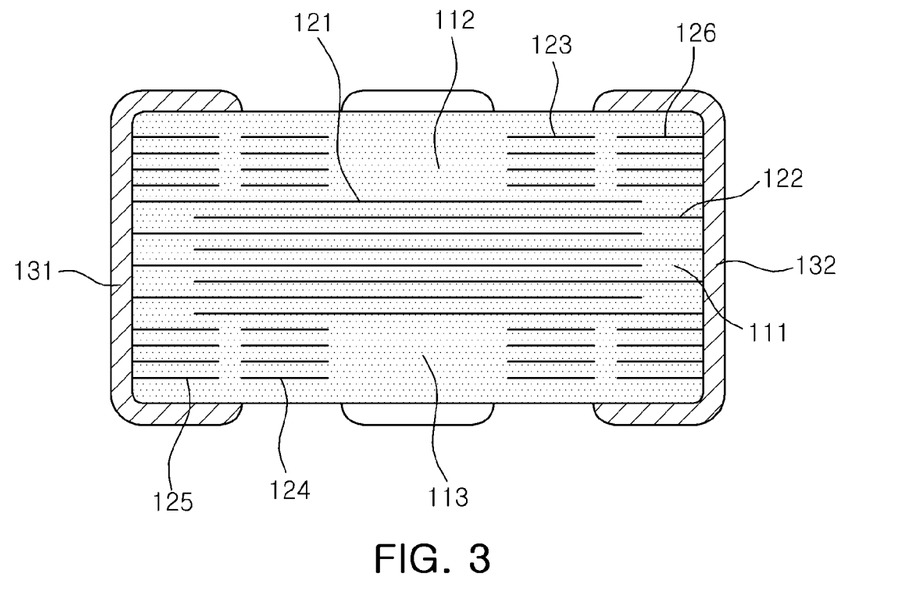
FIG. 3 is a cross-sectional view of line A-A' of FIG. 1.

Referring to FIGS. 1 through 3, a multilayer ceramic capacitor 100 according to the embodiment of the invention may include a ceramic body 110 including a plurality of dielectric layers 111 laminated in a thickness direction thereof, first and second external electrodes 131 and 132, first and second terminal electrodes 141 and 142, and first and fourth internal electrodes 121 to 124.

The ceramic body 110 may be formed by laminating the plurality of dielectric layers 111 and then sintering the same, and adjacent dielectric layers 111 may be integrated with each other such that boundaries therebetween may not be readily apparent.

In addition, the ceramic body 110 may have a hexahedral shape. In the present embodiment, surfaces of the ceramic body 110 facing each other in the thickness direction may be defined as first and second main surfaces, surfaces connecting the first and second main surfaces and facing each other in a length direction may be defined as third and fourth end surfaces, and surfaces facing each other in a width direction may be defined as fifth and sixth side surfaces.

In this case, in a cross-section of the multilayer ceramic capacitor 100 taken in a length-thickness direction, a portion of the multilayer ceramic capacitor 100 in which the internal electrodes are disposed to form capacitance may be defined as an active layer, and portions thereof other than the active layer may be defined as margin portions.

Among the margin portions, upper and lower margin portions above and below the active layer in the thickness direction may be defined as an upper cover layer 112 and a lower cover layer 113, respectively.

The upper cover layer 112 and lower cover layer 113 may be formed by sintering a ceramic sheet which is similar to the dielectric layer 111 formed between the first and second internal electrodes 121 and 122.

In addition, the plurality of dielectric layers including the upper cover layer 112 and the lower cover layer 113 may be in a sintered state, and adjacent dielectric layers may be integrated with each other such that boundaries therebetween may not be readily apparent without using a scanning electron microscope (SEM).

The dielectric layers 111 may include a ceramic material having high permittivity, for example, a barium titanate (BaTiO$_3$)-based ceramic powder, or the like. However, the invention is not limited thereto as long as sufficient capacitance may be obtained.

Further, in addition to the ceramic powder, various ceramic additives such as a transition metal oxide or carbide, a rare-earth element, magnesium(Mg), aluminum(Al), and the like, an organic solvent, a plasticizer, a binder, a dispersant, or the like, may be added to the dielectric layer 111, as needed.

Referring to FIGS. 2A and 2B, the first and second internal electrodes 121 and 122 having opposite polarities may be formed on at least one surface of ceramic sheets forming the dielectric layers 111 and stacked within the ceramic body 110. The first and second internal electrodes 121 and 122 may include first and second lead portions 121a and 122a alternately exposed through the fifth and sixth side surfaces of the ceramic body 110, respectively, having each of the dielectric layers 111 interposed therebetween. In addition, the first and second internal electrodes 121 and 122 may be exposed through the third and fourth end surfaces of the ceramic body 110, respectively.

In this case, the first and second internal electrodes 121 and 122 may be electrically insulated from each other by the dielectric layer 111 disposed therebetween, and the capacitance of the multilayer ceramic capacitor 100 may be in proportion to an overlap area of the first and second internal electrodes 121 and 122 in a direction in which the dielectric layers 111 are laminated, except for an area of the first and second lead portions 121a and 122a.

In addition, the first and second internal electrodes 121 and 122 may be formed of a conductive metal, for example, one of silver (Ag), lead (Pb), platinum (Pt), nickel (Ni), and copper (Cu), or alloys thereof, but the invention is not limited thereto.

Referring to FIG. 2C, the third and fourth internal electrodes 123 and 124 may be formed to face each other on a single dielectric layer of the upper cover layer 112 or the lower cover layer 113. The third and fourth internal electrodes 123 and 124 may include third and fourth lead portions 123a and 124a exposed through the fifth and sixth side surfaces, respectively, so as to be connected to the first terminal electrode 141 and the second terminal electrode 142, respectively.

In addition, the dielectric layer having the third and fourth internal electrodes 123 and 124 disposed thereon may have first and second dummy electrodes 125 and 126 formed thereon, the first and second dummy electrodes 125 and 126 being connected to the first and second external electrodes 131 and 132, respectively. The third and fourth internal electrodes 123 and 124 and the first and second dummy electrodes 125 and 126 may have respective gaps therebetween so as to be spaced apart from one another in a length direction of the dielectric layer.

Figure 5:
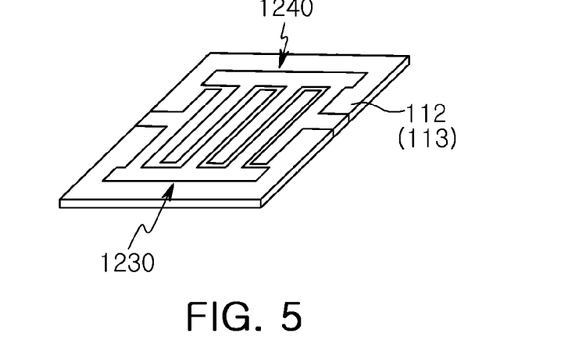
FIG. 5 is a perspective view showing another example of third and fourth internal electrodes applied to a multilayer ceramic capacitor according to an embodiment of the present invention.
Figure 6:
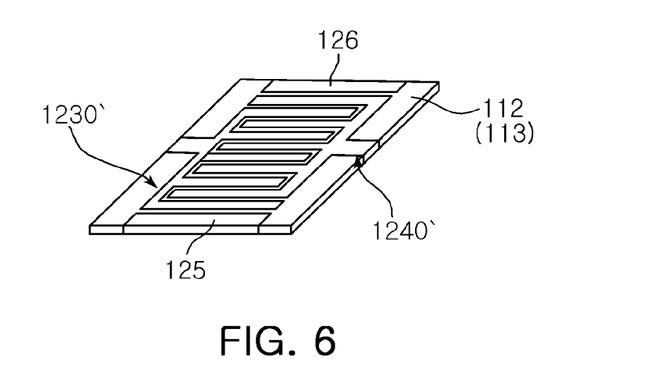
FIG. 6 is a perspective view showing another example of third and fourth internal electrodes applied to a multilayer ceramic capacitor according to an embodiment of the present invention.

Meanwhile, according to other embodiments of the invention, third and fourth internal electrodes 1230 and 1240 may have a comb shape as shown in FIG. 5, and third and fourth internal electrodes 1230' and 1240' may have a comb shape as shown in FIG. 6.

The first and second external electrodes 131 and 132 may be formed on the third and fourth end surfaces of the ceramic body 110, and the first and second terminal electrodes 141 and 142 may be formed on the fifth and sixth side surfaces of the ceramic body 110.

In this case, the first external electrode 131 may be connected to the exposed portion of the first internal electrode 121 and the first dummy electrode 125, and the second external electrode 132 may be connected to the exposed portion of the second internal electrode 122 and the second dummy electrode 126.

In addition, the first terminal electrode 141 may be connected to the first lead portion 121a of the first internal electrode 121 and the third lead portion 123a of the third internal electrode 123, and the second terminal electrode 142 may be connected to the second lead portion 122a of the second internal electrode 122 and the fourth lead portion 124a of the fourth internal electrode 124.

The first and second external electrodes 131 and 132 and the first and second terminal electrodes 141 and 142 may be formed of a conductive paste containing a conductive metal.

The conductive metal may be nickel (Ni), copper (Cu), tin (Sn), or alloys thereof, but the invention is not limited thereto.

The conductive paste may further include an insulating material, and the insulating material may be glass, without being limited thereto.

Here, a method of forming the first and second external electrodes 131 and 132 is not particularly limited. That is, the first and second external electrodes 131 and 132 may be formed by dipping the ceramic body 110 or by using other methods such as a plating method, and the like, as needed.

Meanwhile, first and second plating layers (not shown) may be formed on the first and second external electrodes 131 and 132.

The first and second plating layers may include a nickel (Ni) plating layer formed on the first and second external electrodes 131 and 132 and a tin (Sn) plating layer formed on the nickel plating layer.

The first and second plating layers as described above are provided to increase adhesion strength between the multilayer ceramic capacitor 100 and a circuit board at the time of mounting the multilayer ceramic capacitor 100 on the circuit board, or the like, by soldering, or the like. The plating process may be performed by a method known in the art, and a lead-free plating process is preferable in consideration of eco-friendly factors, but the invention is not limited thereto.

Mounting Circuit Board for Multilayer Ceramic Capacitor

Figure 4:
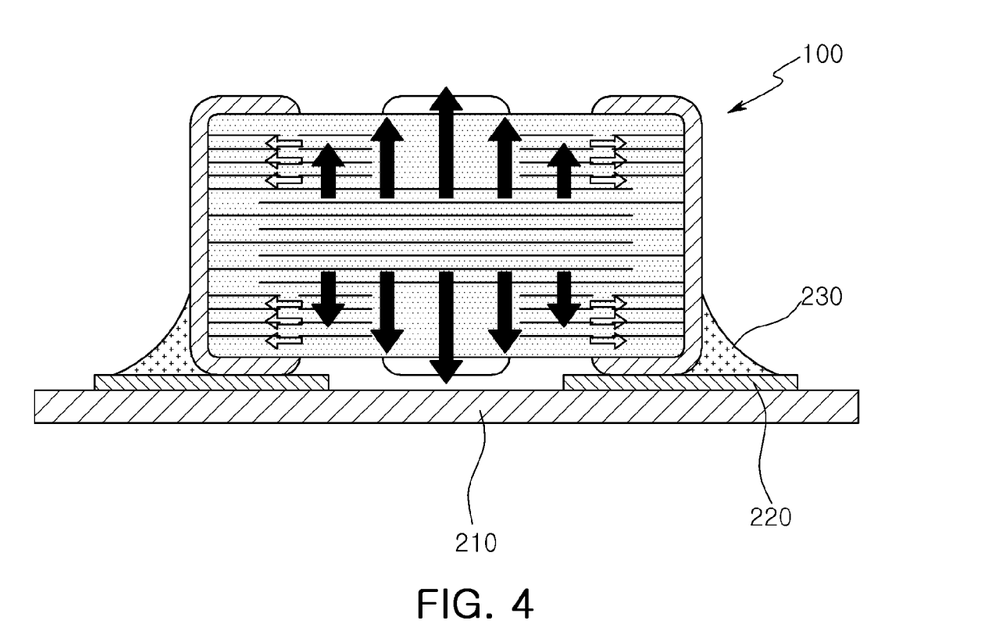
FIG. 4 is a perspective view schematically showing a mounting circuit board for a multilayer ceramic capacitor according to an embodiment of the present invention.

FIG. 4 is a perspective view schematically showing a mounting circuit board for a multilayer ceramic capacitor according to an embodiment of the present invention.

Referring to FIG. 4, a mounting circuit board for the multilayer ceramic capacitor 100 according to the present embodiment may include a circuit board 210 having the multilayer ceramic capacitor 100 mounted thereon, and first and second electrode pads 220 formed on the circuit board 210 to be spaced apart from each other.

Here, the multilayer ceramic capacitor 100 may be mounted such that the second main surface of the ceramic body 110 and the circuit board 210 face each other, and may be electrically connected to the circuit board 210 by a solder 230 in a state in which the first and second external electrodes 131 and 132 are positioned to contact the first and second electrode pads 220, respectively.

Modified Examples

Referring to FIGS. 7 through 11, a multilayer ceramic capacitor 100' according to another embodiment of the present invention may include a ceramic body 110 including a plurality of dielectric layers 111 laminated in a thickness direction thereof, first and second external electrodes 131 and 132, and first and second dummy electrodes 152 and 153.

Here, details thereof are overlapped with those described in the previous embodiment of the present invention, so a description thereof will be omitted.

Figure 7:
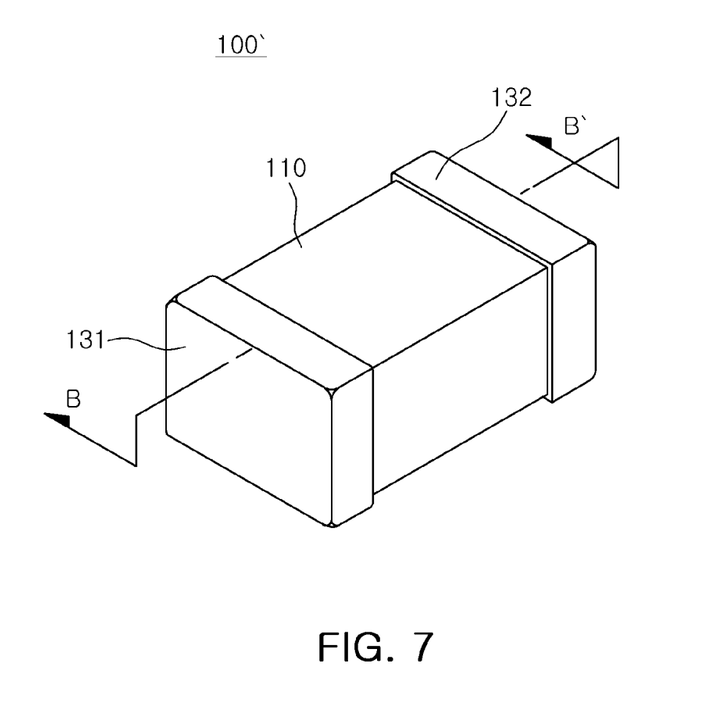
FIG. 7 is a perspective view schematically showing a multilayer ceramic capacitor according to another embodiment of the present invention.
Figure 8A:
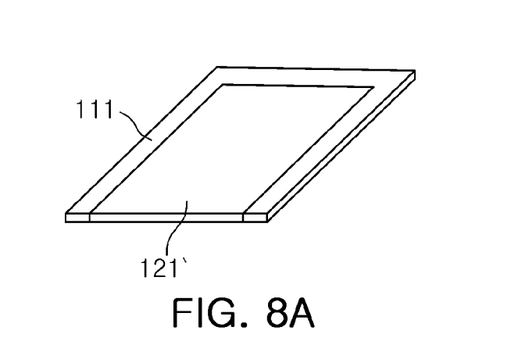
FIGS. 8A through 8C are perspective views showing internal electrodes, dummy electrodes, and a floating electrode applied to the multilayer ceramic capacitor of FIG. 7.
Figure 8B:
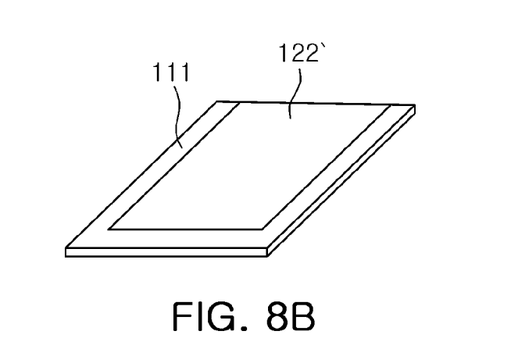

The first and second external electrodes 131 and 132 may be formed on the third and fourth end surfaces of the ceramic body 110, and first and second internal electrodes 121' and 122' may be disposed to face each other within the ceramic body 110, having the dielectric layer interposed therebetween, and be electrically connected to the first and second external electrodes 131 and 132, respectively.

Figure 8C:
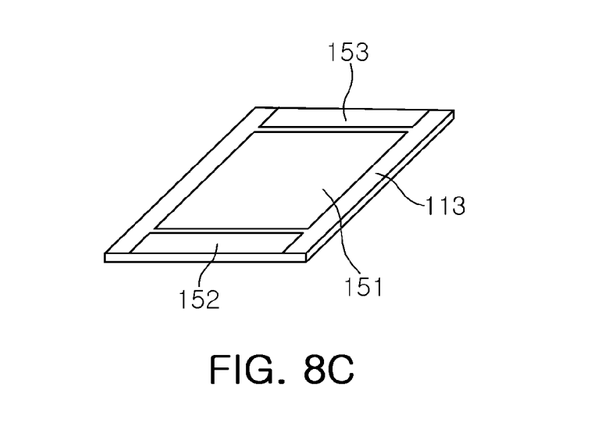
Figure 9:
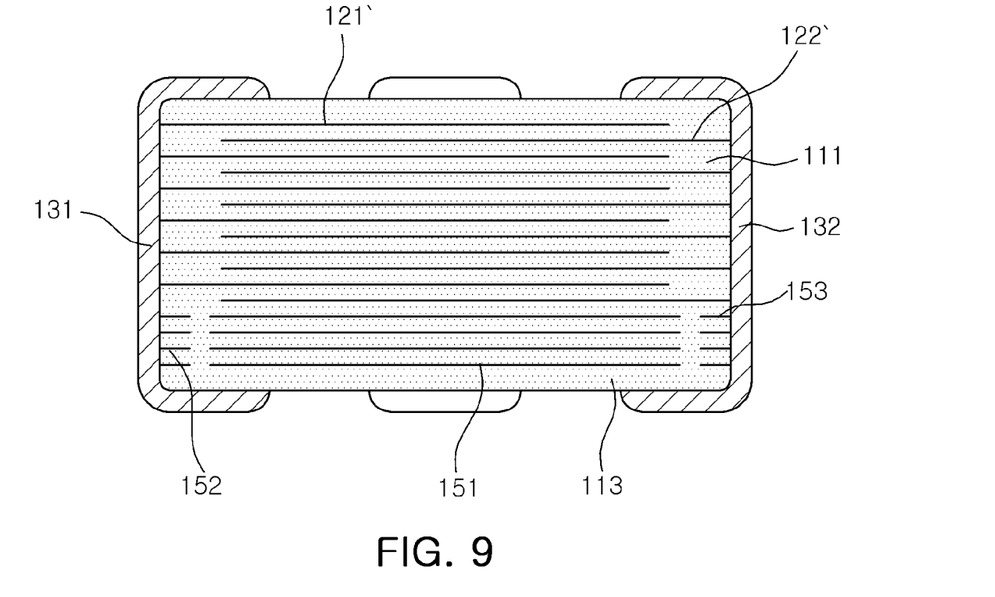
FIG. 9 is a cross-sectional view taken along line B-B' of FIG. 7.
Figure 10:
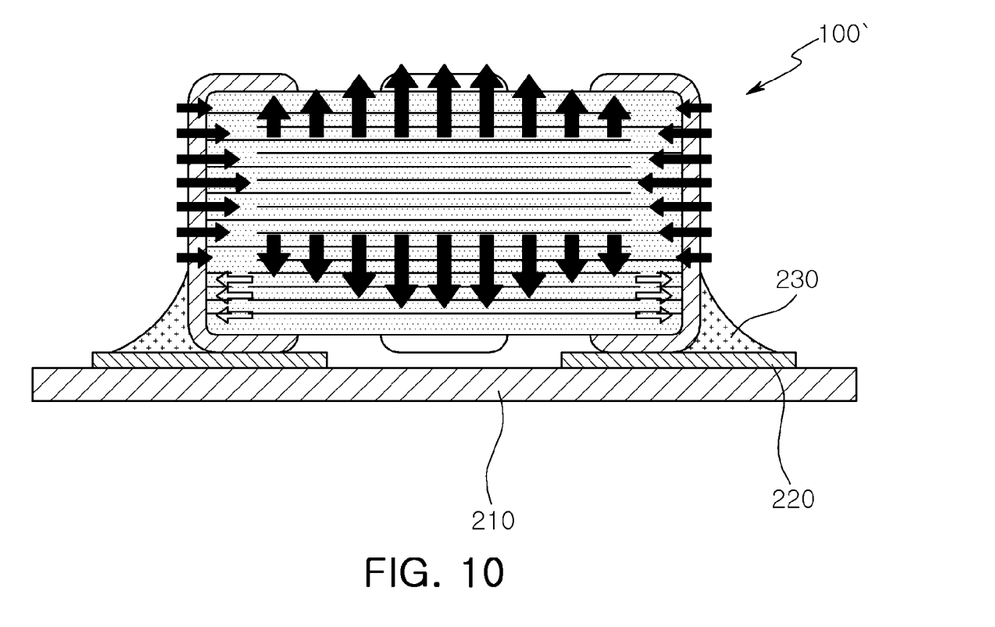
FIG. 10 is a perspective view schematically showing a mounting circuit board for a multilayer ceramic capacitor according to another embodiment of the present invention.
Figure 11:
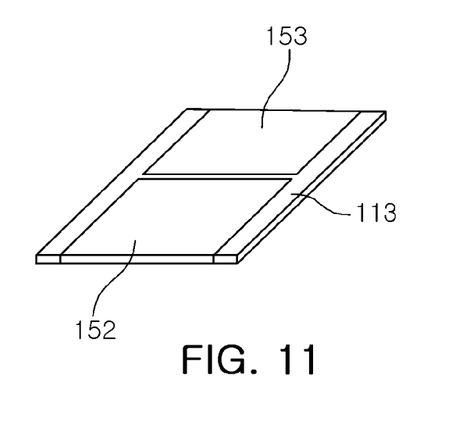
FIGS. 11 through 13 are perspective views showing another example of dummy electrodes applied to a multilayer ceramic capacitor according to another embodiment of the present invention.

The first and second dummy electrodes 152 and 153 may be disposed on a single dielectric layer of the lower cover layer 113 so as to face each other in a length direction of the dielectric layer, and be connected to the first and second external electrodes 131 and 132.

Here, as shown in FIG. 8C, a floating electrode 151 may be further formed between the first and second dummy electrodes 152 and 153 so as to be spaced apart therefrom in the length direction of the dielectric layer.

Figure 12:
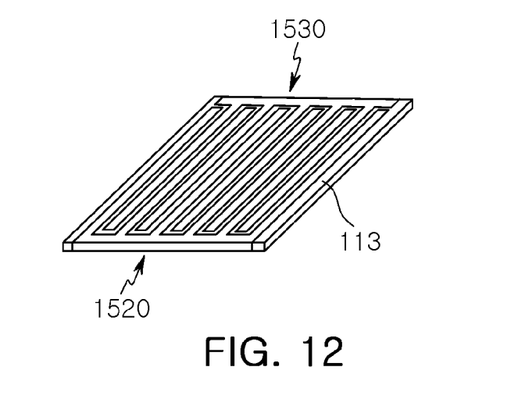
Figure 13:
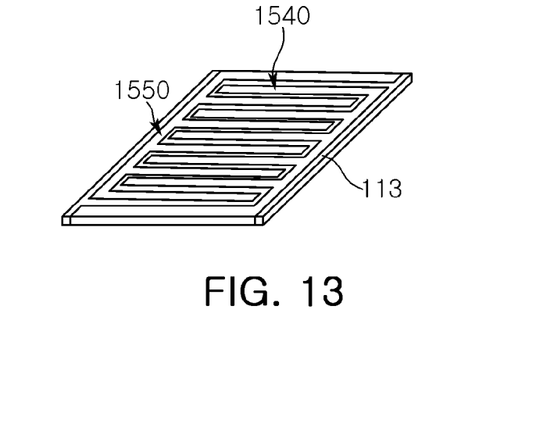

Meanwhile, according to other embodiments of the invention, first and second dummy electrodes 1520 and 1530 may have a comb shape as shown in FIG. 12, and first and second dummy electrodes 1540 and 1550 may have a comb shape as shown in FIG. 13, as needed.

As set forth above, according to embodiments of the present invention, since vibrations generated in a multilayer ceramic capacitor due to a piezoelectric phenomenon are absorbed by internal electrodes, acoustic noise caused by the transmission of the vibrations to a circuit board may be decreased.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
   a ceramic body including a plurality of dielectric layers and having first and second main surfaces facing each other in a thickness direction, third and fourth end surfaces facing each other in a length direction, and fifth and sixth side surfaces facing each other in a width direction;
   first and second external electrodes formed on the third and fourth end surfaces of the ceramic body;
   first and second terminal electrodes formed on the fifth and sixth side surfaces of the ceramic body;
   an active layer including a first internal electrode simultaneously connected to the first terminal electrode and the first external electrode and a second internal electrode simultaneously connected to the second terminal electrode and the second external electrode, the first and second internal electrodes being disposed to face each other in the ceramic body, having each of the dielectric layers interposed therebetween;
   upper and lower cover layers formed above and below the active layer; and
   third and fourth internal electrodes disposed to face each other on a single dielectric layer of the upper or lower cover layer and connected to the first and second terminal electrodes, respectively.

2. The multilayer ceramic capacitor of claim 1, wherein the dielectric layer on which the third and fourth internal electrodes are disposed has first and second dummy electrodes formed thereon, the first and second dummy electrodes being connected to the first and second external electrodes, respectively.

3. The multilayer ceramic capacitor of claim 1, wherein the third and fourth internal electrodes have a comb shape.

4. A multilayer ceramic capacitor comprising:
   a ceramic body including a plurality of dielectric layers and having first and second main surfaces facing each other in a thickness direction, third and fourth end surfaces facing each other in a length direction, and fifth and sixth side surfaces facing each other in a width direction;
   first and second external electrodes formed on the third and fourth end surfaces of the ceramic body;
   an active layer including first and second internal electrodes electrically connected to the first and second external electrodes, respectively, and disposed to face each other in the ceramic body, having each of the dielectric layers interposed therebetween;
   upper and lower cover layers formed above and below the active layer; and
   first and second dummy electrodes disposed on a single dielectric layer of the upper or lower cover layer to face each other in a length direction of the dielectric layer and connected to the first and second external electrodes, respectively.

5. The multilayer ceramic capacitor of claim 4, wherein the dielectric layer on which the first and second dummy electrodes are disposed has a floating electrode formed thereon, the floating electrode being disposed between the first and second dummy electrodes so as to be spaced apart therefrom in the length direction of the dielectric layer.

6. The multilayer ceramic capacitor of claim 4, wherein the first and second dummy electrodes have a comb shape.

7. A mounting circuit board for a multilayer ceramic capacitor, the mounting circuit board comprising:
   a circuit board having first and second electrode pads disposed thereon; and
   at least one multilayer ceramic capacitor mounted on the circuit board,
   wherein the multilayer ceramic capacitor includes:
   a ceramic body including a plurality of dielectric layers and having first and second main surfaces facing each other in a thickness direction, third and fourth end surfaces facing each other in a length direction, and fifth and sixth side surfaces facing each other in a width direction;
   first and second external electrodes formed on the third and fourth end surfaces of the ceramic body and electrically connected to the first and second electrode pads, respectively;
   first and second terminal electrodes formed on the fifth and sixth side surfaces of the ceramic body;
   an active layer including a first internal electrode simultaneously connected to the first terminal electrode and the first external electrode and a second internal electrode simultaneously connected to the second terminal electrode and the second external electrode, the first and second internal electrodes being disposed to face each other in the ceramic body, having each of the dielectric layers interposed therebetween;

upper and lower cover layers formed above and below the active layer; and third and fourth internal electrodes disposed to face each other on a single dielectric layer of the upper or lower cover layer and connected to the first and second terminal electrodes, respectively.

8. The mounting circuit board of claim 7, wherein the dielectric layer on which the third and fourth internal electrodes are disposed has first and second dummy electrodes formed thereon, the first and second dummy electrodes being connected to the first and second external electrodes, respectively.

9. The mounting circuit board of claim 7, wherein the third and fourth internal electrodes have a comb shape.

10. A mounting circuit board for a multilayer ceramic capacitor, the mounting circuit board comprising:

a circuit board having first and second electrode pads disposed thereon; and at least one multilayer ceramic capacitor mounted on the circuit board, wherein the multilayer ceramic capacitor includes:

a ceramic body including a plurality of dielectric layers and having first and second main surfaces facing each other in a thickness direction, third and fourth end surfaces facing each other in a length direction, and fifth and sixth side surfaces facing each other in a width direction;

first and second external electrodes formed on the third and fourth end surfaces of the ceramic body and electrically connected to the first and second electrode pads;

an active layer including first and second internal electrodes electrically connected to the first and second external electrodes, disposed to face each other in the ceramic body, having each of the dielectric layers interposed therebetween;

upper and lower cover layers formed above and below the active layer; and first and second dummy electrodes disposed on a single dielectric layer of the upper or lower cover layer to face each other in a length direction of the dielectric layer and connected to the first and second external electrodes, respectively.

11. The mounting circuit board of claim 10, wherein the dielectric layer on which the first and second dummy electrodes are disposed has a floating electrode formed thereon, the floating electrode being disposed between the first and second dummy electrodes so as to be spaced apart therefrom in the length direction of the dielectric layer.

12. The mounting circuit board of claim 10, wherein the first and second dummy electrodes have a comb shape.

* * * * *